United States Patent
Katayama

(10) Patent No.: US 7,006,421 B2
(45) Date of Patent: Feb. 28, 2006

(54) OPTICAL INFORMATION RECORDING AND REPRODUCING METHOD AND APPARATUS FOR REPRODUCING INFORMATION UTILIZING MAXIMUM-LIKELIHOOD DECODE

(75) Inventor: Tatsushi Katayama, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 354 days.

(21) Appl. No.: 10/357,225

(22) Filed: Feb. 4, 2003

(65) Prior Publication Data
US 2003/0151988 A1    Aug. 14, 2003

(30) Foreign Application Priority Data
Feb. 8, 2002  (JP)  ............................. 2002-032492
Mar. 20, 2002 (JP)  ............................. 2002-078769

(51) Int. Cl.
G11B 5/09  (2006.01)
(52) U.S. Cl. ................................ 369/59.22; 369/47.25
(58) Field of Classification Search ............ 369/47.25, 369/47.35, 47.36, 47.49, 53.25, 53.28, 53.31, 369/53.38, 53.44, 59.15, 59.22, 124.1
See application file for complete search history.

(56) References Cited

U.S. PATENT DOCUMENTS 5,719,843 A * 2/1998 Nakajima et al. ........ 369/59.22
5,938,791 A   8/1999 Narahara
6,027,825 A   2/2000 Shiratori et al.
6,141,036 A   10/2000 Katayama et al.

FOREIGN PATENT DOCUMENTS

JP    10-21651    1/1998

OTHER PUBLICATIONS

A Window-Margin-Like Procedure for Evaluating PRML Channel Performance, IEEE Transactions on Magnetics, vol. 31, No. 2 (Mar. 1995, pp. 1109 to 1114).

* cited by examiner

*Primary Examiner*—Paul W. Huber
(74) *Attorney, Agent, or Firm*—Fitzpatrick, Cella, Harper & Scinto

(57) ABSTRACT

A method and an apparatus are provided which are capable of evaluating a state of a signal with a fewer number of samples compared with an error rate. A reproducing signal obtained from a magneto-optical disk is subjected to maximum-likelihood decode in a maximum-likelihood decoder, paths coupling with each other in the maximum-likelihood decode is detected by an evaluation index generation unit and, at the same time, a difference of likelihoods (path metrics) of those paths is obtained to adjust a parameter of a recording and reproducing signal or a control signal of an optical pickup based on the likelihood difference. The parameter is, for example, auto-tracking, a gain of an auto-focusing loop, or an offset value, or a gain value of a reproducing signal, a recording power, or a reproducing power intensity.

7 Claims, 17 Drawing Sheets

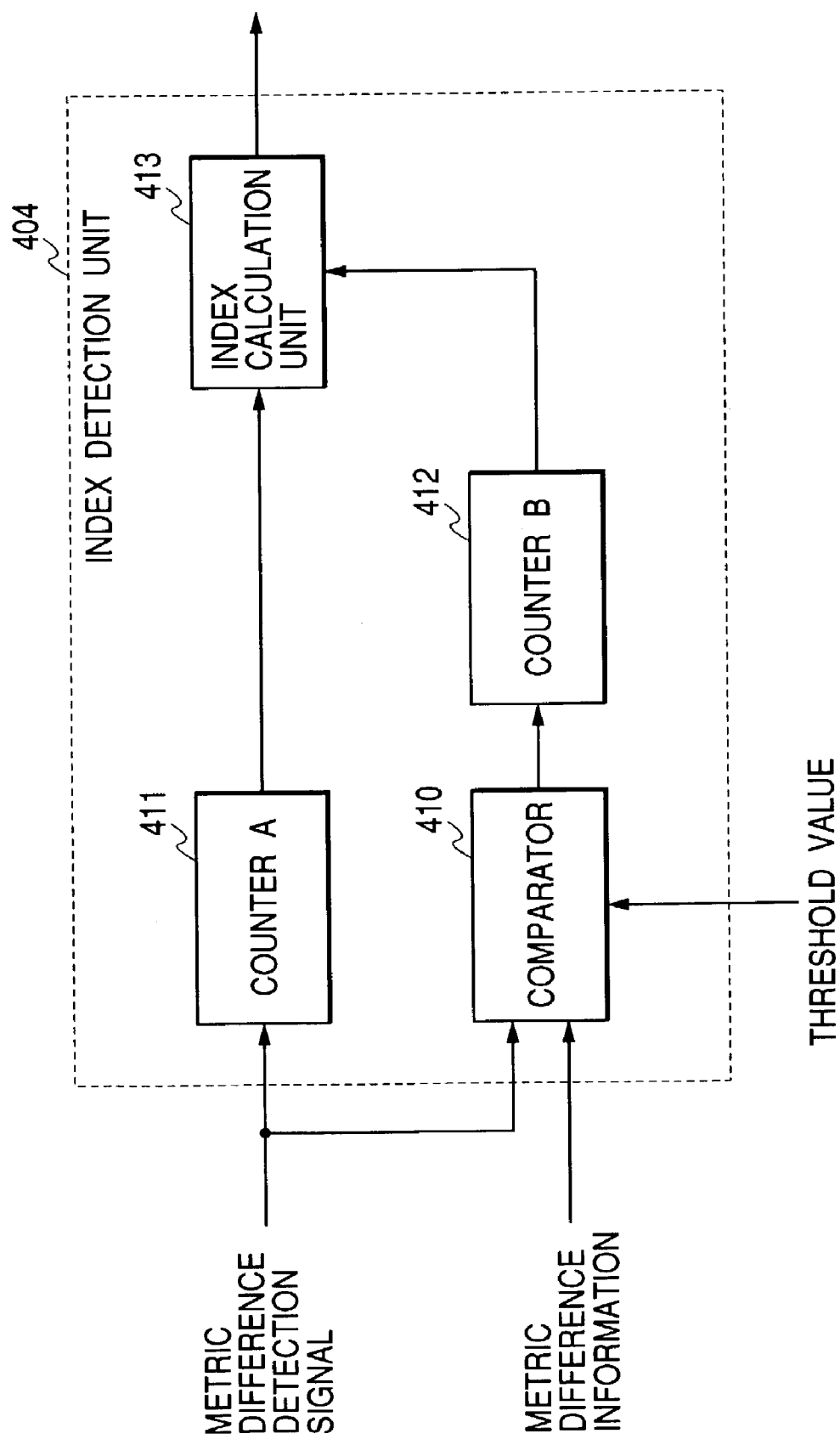

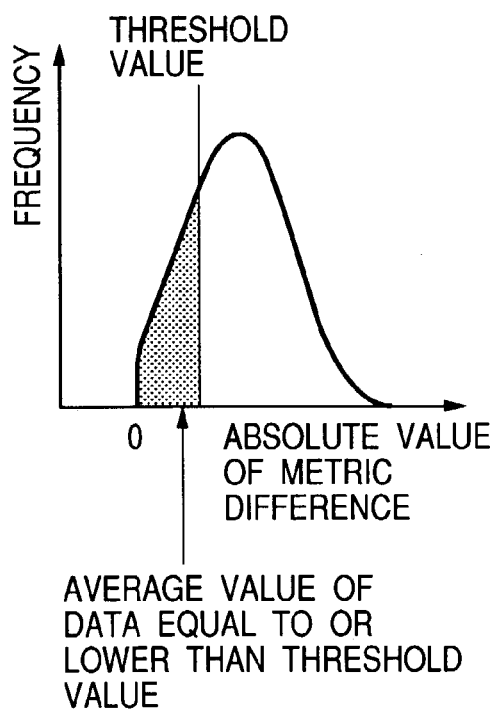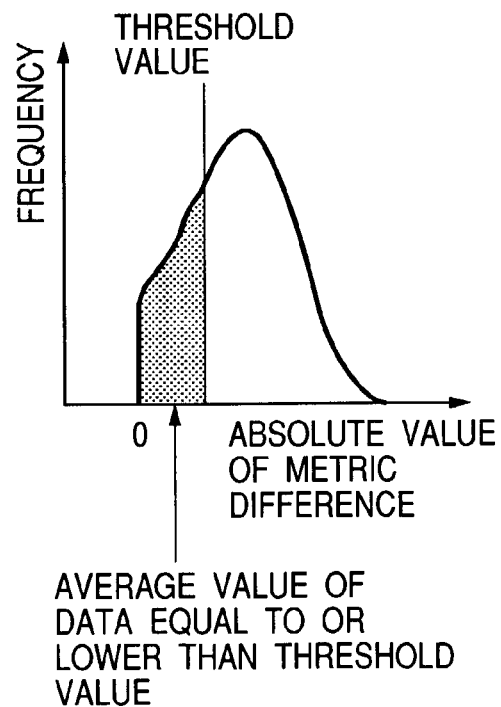
FIG. 14A
IN CASE OFF-TRACK IS SMALL
FIG. 14B
IN CASE OFF-TRACK IS LARGE

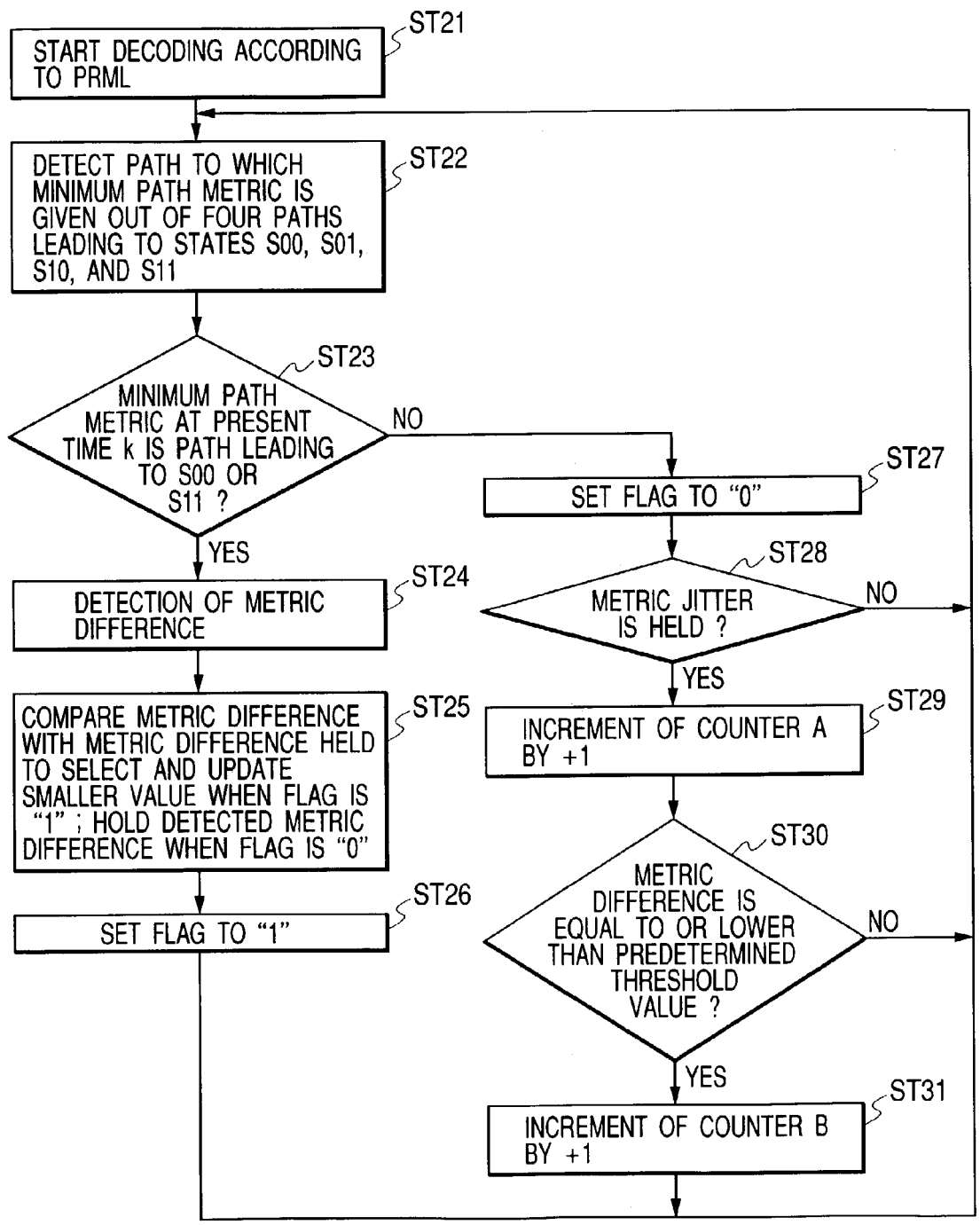

OPTICAL INFORMATION RECORDING AND REPRODUCING METHOD AND APPARATUS FOR REPRODUCING INFORMATION UTILIZING MAXIMUM-LIKELIHOOD DECODE

BACKGROUND OF THE INVENTION

1. Field of the Invention

The present invention relates to an optical information recording and reproducing method and apparatus for reproducing information utilizing maximum-likelihood decode, and in particular to an optical information recording and reproducing method and apparatus for adjusting various parameters for recording and reproduction using evaluation indexes.

2. Related Background Art

Conventionally, an error rate of a reproducing signal is used when adjustment of a recording laser power at the time of recording, a reproducing laser power at the time of reproduction, tracking control, and the like is performed in an optical information recording and reproducing apparatus. This is for recording or reproducing a signal while setting the above-described various parameters to a plurality of predetermined adjustment values and using an adjustment value with a minimum error rate as an optimum value in subsequent recording and reproduction.

However, there is a problem in that a larger number of samples are required and time required for adjustment is extended when an error rate is low in the case in which adjustment values are searched using an error rate as an evaluation index.

In addition, it is disclosed in the literature "A Window-Margin-Like Procedure for Evaluating PRML Channel Performance", IEEE Trans. On Magnetics, Vol. 31, No. 2, March 1995 that a Sequenced Amplitude Margin (SAM) is used as an evaluation index.

This is for using a likelihood of Viterbi decode as an evaluation index. In using the SAM, a likelihood (also called as path metric) of the most sure reproducing signal sequence and a likelihood of a secondly more sure reproducing signal sequence are found at each time to evaluate a likelihood difference.

However, in the case in which a main factor of occurrence of an error in a reproducing signal is an edge portion, in the SAM, there is a problem that a detection sensitivity declines because differences of likelihoods obtained by all signal sequences are used regardless of the edge portion of the reproducing signal, and as a result, an accuracy of an adjusted value falls.

In addition, in the conventional example disclosed in Japanese Patent Application Laid-Open No. 10-21651, a likelihood difference between signal sequences of a minimum Euclidean distance is used targeting only an error of the minimum Euclidean distance. However, an error is not limited to that of the minimum Euclidean distance, and generation of an error depends upon a recording and reproducing system and design parameters such as a partial response characteristic of Partial-Response Maximum-Likelihood (PRML). In addition, since it is necessary to detect a path of the minimum Euclidean distance, an apparatus becomes complicated.

As described above, in the conventionally known method, it is difficult to realize highly accurate parameter adjustment with small number of samples and a simple structure.

In addition, when a mark optically recorded in a recording medium is reproduced, since there is shift (advance and delay) of an edge portion of a signal called jitter and this edge shift becomes a factor of occurrence of an error, it is difficult to increase an adjustment accuracy with a small number of samples.

SUMMARY OF THE INVENTION

The present invention has been devised in view of the above and other drawbacks, and it is an object of the present invention to provide an optical information recording and reproducing method and apparatus capable of performing highly accurate adjustment with a small number of samples and a simple structure.

The optical information recording and reproducing method of the present invention subjects a reproducing signal obtained from a recording medium to maximum-likelihood decode and detects path coupling with each other in the maximum-likelihood decode, and at the same time, obtains a difference of likelihoods of those paths, and adjusts parameters of a recording and reproducing signal or a control signal of an optical pickup based on the likelihood difference.

In addition, the optical information recording and reproducing apparatus of the present invention is provided with a circuit for subjecting a reproducing signal obtained from a recording medium to maximum-likelihood decode, a circuit for detecting paths coupling with each other in the maximum-likelihood decode to obtain a difference of likelihoods of those paths, and a circuit for adjusting parameters of a recording and reproducing signal or a control signal of an optical pickup based on the likelihood difference.

BRIEF DESCRIPTION OF THE DRAWINGS

FIG. 10 is a block diagram of an index detection unit of Embodiment 1 in accordance with the present invention;

FIGS. 14A and 14B are graphs explaining evaluation index generation of Embodiment 2 in accordance with the present invention;

FIG. 15 is a flow chart of processing for evaluation index generation of Embodiment 3 in accordance with the present invention;

DETAILED DESCRIPTION OF THE PREFERRED EMBODIMENTS

Figure 1:
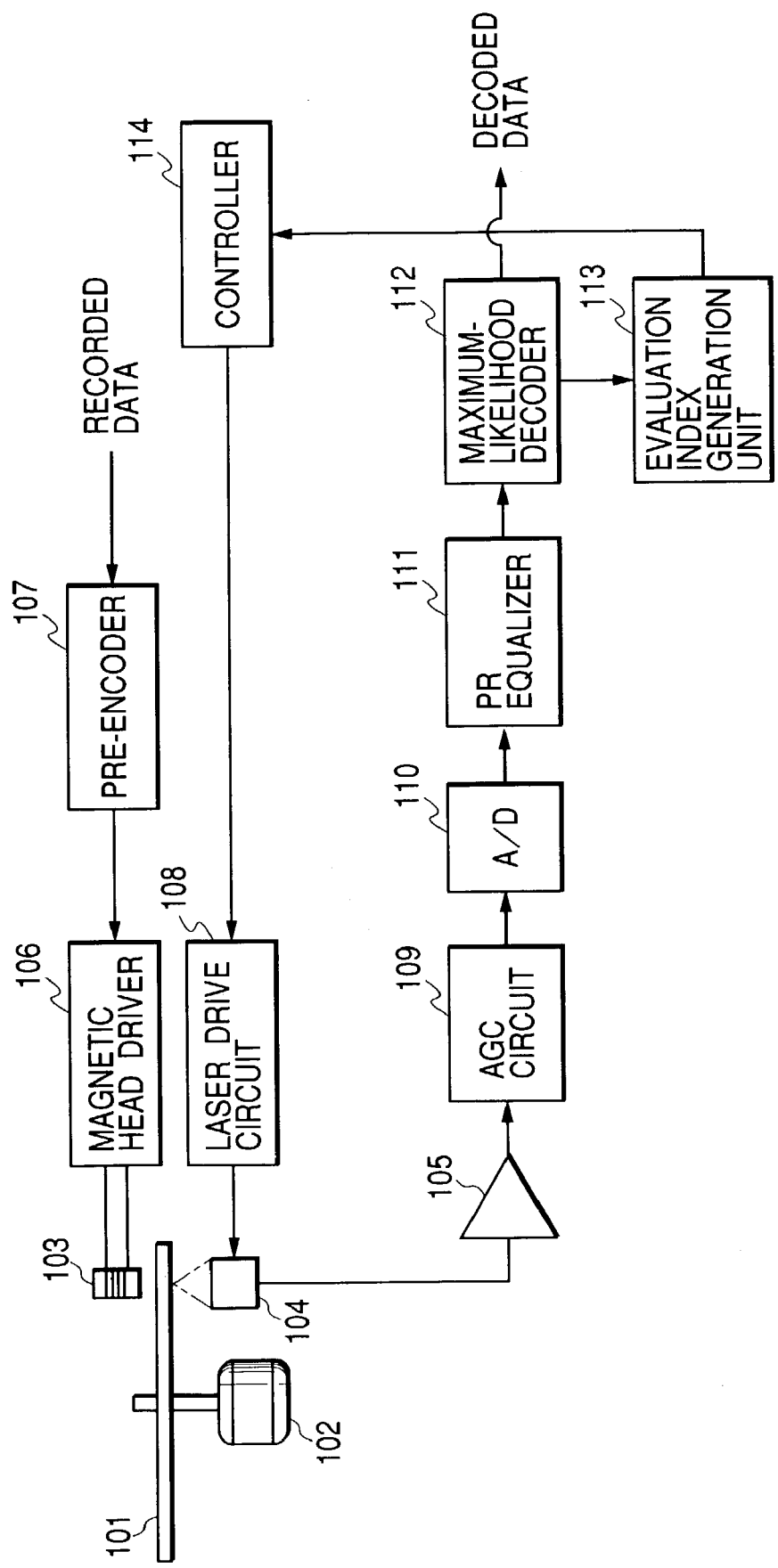
FIG. 1 is a block diagram showing a structure of Embodiment 1 of an optical information recording and reproducing apparatus of the present invention.

When a mark optically recorded in a recording medium is reproduced, it is desirable that a conversion point of a reproducing signal (zero-cross point of a signal) and a conversion point of an original signal coincide with each other on a time axis. However, actually, there is shift (advance and delay) of an edge portion of a signal called jitter. Since such an edge shift becomes a cause of an error in decoding a reproducing signal, it is desired that an influence of the edge shift be controlled as much as possible.

In the present invention, an index on which an influence of edge shift is sufficiently reflected, that is, a metric difference in an edge portion of a reproducing signal is utilized as an evaluation index representing a state of the reproducing signal. That is, a difference of two metrics to be compared increases if the influence of the edge shift is small, and the metric difference decreases if the influence of the edge shift is large. Parameters of a recording and reproducing signal or a control signal of an optical pickup are adjusted based on this metric difference, whereby highly accurate adjustment taking into account the edge shift becomes possible with a simple structure even if there is only a small number of samples only in the edge portion.

As a cause of edge shift in optical recording and reproduction, there are known an aberration in a reproducing optical system, a noise in a circuit system, a limited reproduction spot diameter, and the like ("Optical Disk Technique", Morio Ogami, et al., issued by Radio Gijutsu Company). In particular, in the case of a magneto-optical recording and reproducing apparatus, there is edge shift caused by a floating magnetic field. Detailed embodiments of the present invention will be hereinafter described in a form of a magneto-optical recording and reproducing apparatus.

First, a floating magnetic field that is one of the causes of the edge shift will be described in the case of the magneto-optical recording and reproducing apparatus. A temperature of a laser beam irradiation part of a magneto-optical recording medium reaches the Curie point by irradiation of laser beams and magnetization is eliminated at recording time in magneto-optical recording of the magneto-optical recording and reproducing apparatus. However, magnetization and a floating magnetic field due to the magnetization exist in the peripheral part where a temperature has not reached to the Curie point. A magnetic domain wall serving as a recording mark end is formed in a rear end in a traveling direction of laser beams. When the magnetic domain wall serving as a recording mark end is formed, the floating magnetic field acts on a modulation magnetic field in a manner of being superimposed on a modulation magnetic field for magnetic domain wall formation, which is applied from the outside by a magnetic head. A magnitude of this floating magnetic field changes according to a distance between a magnetic domain wall formed immediately before forming the magnetic domain wall and a magnetic domain wall to be formed next, that is, a recording mark length to be formed and a recording mark length positioned before it. Therefore, an intensity of the floating magnetic field acting on the magnetic domain wall forming part is different according to a mark length (or mark length row) to be recorded.

Figure 19A:
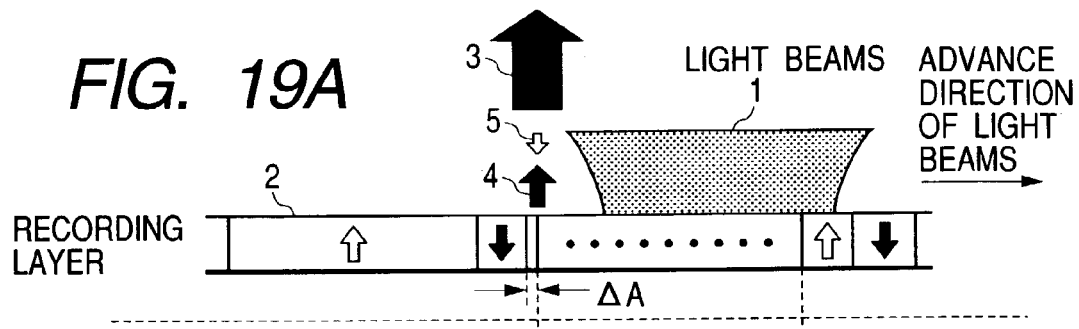
FIGS. 19A, 19B, and 19C illustrate a floating magnetic field.
Figure 19B:
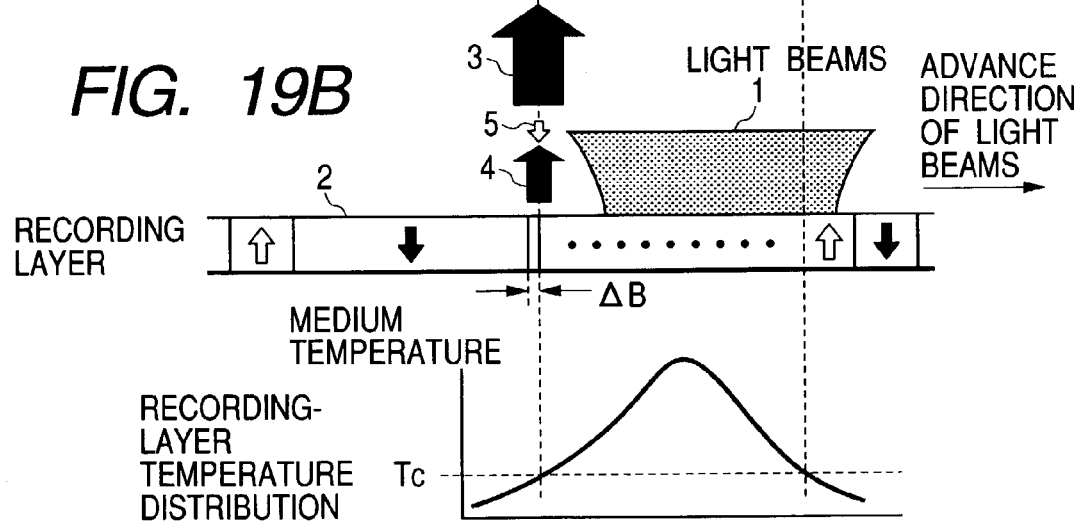
Figure 19C:
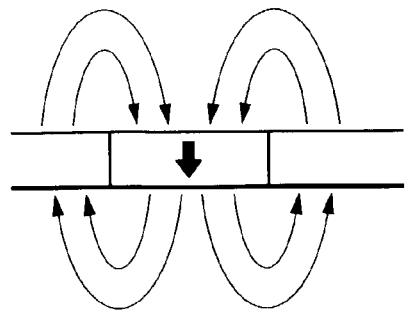

The above-described floating magnetic field will be hereinafter described. FIG. 19C illustrates magnetization and a floating magnetic field attributable to the magnetization. As shown in FIG. 19C, a magnetic domain wall serving as a recording mark end is formed in a rear end in a traveling direction of laser beams, and the floating magnetic field is superimposed on a modulation electric field applied by a magnetic field from the outside for forming the magnetic domain wall.

As described above, a magnitude of this floating magnetic field changes according to a distance between a magnetic domain wall formed immediately before forming the magnetic domain wall and a magnetic domain wall to be formed next, that is, a recording mark length to be formed and a recording mark length positioned before it. In addition, a forming position of the magnetic domain wall is decided in a relationship between a temperature and a magnetic intensity. Here, a laser beam intensity and an applied magnetic field intensity from the magnetic head are maintained in a stationary state. Since an intensity of a floating magnetic field to be superimposed differs if a recording mark length or a recording mark length row is different, a magnetic field intensity to be applied to a magnetic domain forming position becomes equal to the magnetic field intensity from the magnetic head superimposed by the floating magnetic field intensity. As described above, a magnetic field intensity to be substantially applied to the magnetic domain forming position is different according to a recording mark length or a recording mark length row to be formed. As a result, a phenomenon appears in which a magnetic domain wall forming position is different according to a recording mark length.

The floating magnetic field will be further described with reference to FIGS. 19A to 19C. FIG. 19A shows the case in which longest and shortest recording marks on a recording symbol are sequentially formed, and FIG. 19B shows the case in which shortest and longest recording marks on a recording symbol are sequentially formed. In FIGS. 19A to 19C, reference numeral 1 denotes light beams, and an arrow 2 shows a magnetization state of a recording layer of a magneto-optical recording medium, an arrow 3 shows an intensity and a direction of an applied magnetic field from a magnetic head, and an arrow 4 shows an intensity and a direction of a floating magnetic field according to a magnetization state immediately before forming a magnetic domain wall. An arrow 5 shows an intensity and a direction of a floating magnetic field from a recording mark positioned further before the mark.

Here, due to characteristics of an magneto-optical recording medium, the floating magnetic field of the arrow 4 is applied in a direction for increasing an applied magnetic field from the magnetic head at the time when the magnetic domain wall is formed, and the floating magnetic field of the arrow 5 is applied in a direction for reducing an applied magnetic field from the magnetic head at the time when the magnetic domain wall is formed.

Therefore, a sum of applied electric field of the arrows 3 to 5 in a magnetic domain wall forming part is different in the cases of FIGS. 19A and 19B. In the case of FIG. 19B, a higher magnetic field intensity is applied to the recording layer. As a result, when viewed from a certain reference position, the magnetic domain wall forming position is formed in a position deviated by ΔA in the case of FIG. 19A and in a position deviated by ΔB in the case of FIG. 19B. As a result, a relationship between ΔA and ΔB is ΔA<ΔB. Thus, an edge portion of a reproducing signal is affected by the floating magnetic field to shift (advance or delay).

Embodiments of the present invention will be hereinafter described in detail with reference to the accompanying drawings.

(Embodiment 1)

FIG. 1 is a block diagram showing a structure of Embodiment 1 of a magneto-optical recording and reproducing apparatus of the present invention. In FIG. 1, reference numeral 101 denotes a magneto-optical disk serving as an information recording medium and 102 denotes a spindle motor for rotating the magneto-optical disk 101 at a predetermined speed. A magnetic head 103, which generates a magnetic field modulated according to a recording signal, is disposed above the upper surface of the magneto-optical disk 101, and, opposed to the magnetic head 103, an optical head 104 is disposed below the lower surface of the magneto-optical disk 101.

The optical head 104 is for irradiating light beams for recording on the magneto-optical disk 101 to record information therein or irradiate light beams for reproduction on the magneto-optical disk 101 to detect reflected light therefrom and reproduce recording information. In this case, a semiconductor laser (not shown) serving as a light source for recording and reproduction and an optical sensor (not shown) for detecting reflected light from a medium are provided in the optical head 104. The semiconductor laser is driven by a laser drive circuit 108 and light beams of the semiconductor laser are controlled as the light beam for recording and as the light beam for reproduction, thereby recording and reproducing information.

In recording information, the magneto-optical disk 101 is rotated at a predetermined speed by the drive of the spindle motor 102. In this state, recorded data is supplied to a pre-encoder 107. In the pre-encoder 107, for example, modulation of data of a NRZI sequence is performed. A modulation signal outputted from the pre-encoder 107 is supplied to a magnetic head driver 106. The magnetic head driver 106 drives the magnetic head 103 for generating an external magnetic field according to the modulation signal. Consequently, the magnetic head 103 generates a magnetic field according to the modulation signal to apply it to the magneto-optical disk 101. At the same time, the light beams from the optical head 104 are irradiated on the magneto-optical disk 101 according to the drive signal from the laser drive circuit 108, whereby data is recorded on the magneto-optical disk 101.

On the other hand, in reproducing information, the magneto-optical disk 101 is controlled so as to rotate at a predetermined speed, and light beam for reproduction is irradiated on the magneto-optical disk 101 from the optical head 104. Reflected light from the magneto-optical disk 101 is detected by the optical sensor, and an RF signal is generated. This RF signal is supplied to an AGC circuit 109 through a preamplifier 105. The AGC circuit 109 performs gain control according to the RF signal to generate an RF signal of a predetermined amplitude.

Figure 18:
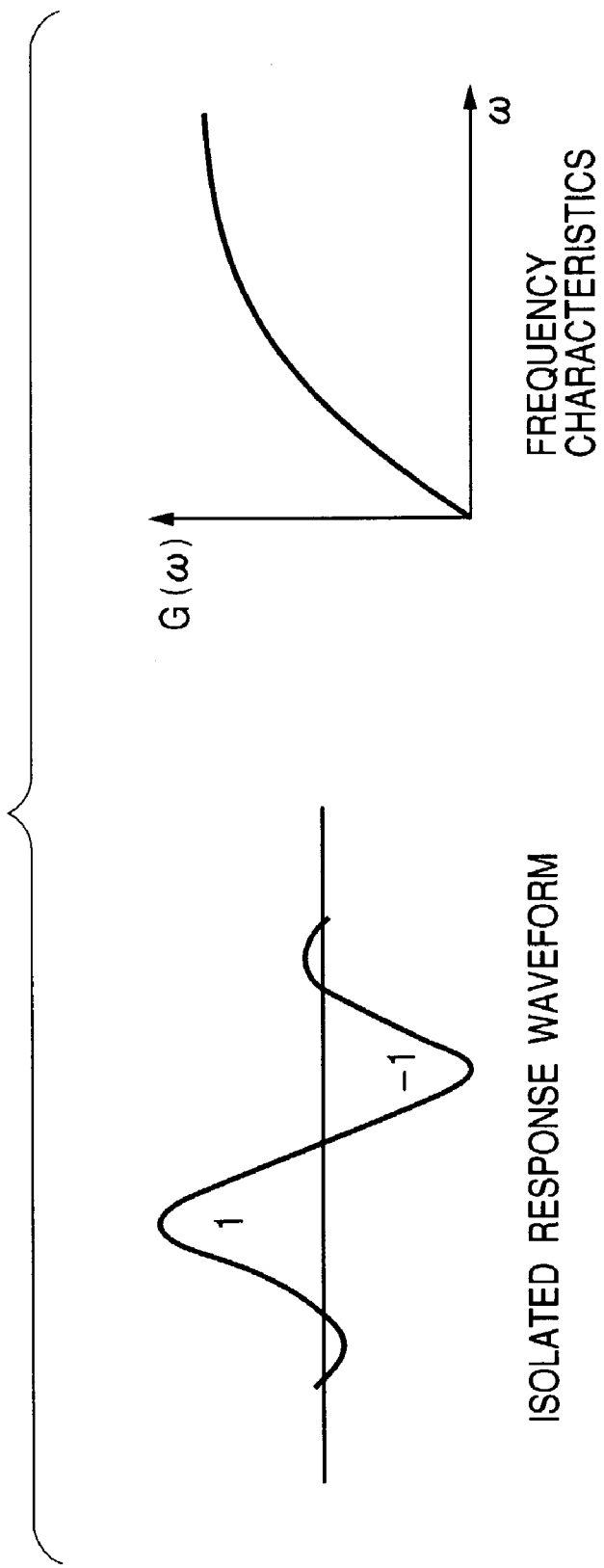
FIG. 18 illustrates a PR (1, −1) characteristic in accordance with the present invention.

A reproducing RF signal processed by the AGC circuit 109 is converted into a digital signal by an A/D converter 110. The RF signal converted into the digital signal is subjected to PR (1, −1) processing in a PR equalizer 111 of PRML decode and supplied to a maximum-likelihood decoder 112. PR represents a partial response. Here, isolated waveform response and a PR (1, −1) characteristic of frequency characteristics shown in FIG. 18 are used. The maximum-likelihood decoder 112 applies decode processing to the reproducing signal subjected to the PR processing by maximum-likelihood decode and outputs decoded data. On the other hand, likelihood information at each time generated in maximum-likelihood decode is supplied to an evaluation index generation unit 113. The evaluation index generation unit 113 generates an index value for evaluating a quality of the reproducing signal and supplies the index value to a controller 114.

The controller 114 generates an overall control signal for the magneto-optical recording and reproducing apparatus. In this embodiment, control information for controlling a gain value of a reproducing signal, a laser recording power at the time of recording, a laser reproducing power at the time of reproduction, a gain or an offset value of auto-tracking or auto-focusing loop, or the like is controlled in the controller. An index for evaluating appropriateness of a control adjustment value in this case is detected in the evaluation index generation unit 113.

In this embodiment, an evaluation index is generated based on a likelihood indicating probability of a decode data sequence of PRML. In this context, an evaluation index will be described in the case in which an RLL (1, 7) symbol is used, a recording symbol sequence with a minimum run length of 1 is recorded in a Non Return to Zero Inverted (NRZI) sequence and reproduced by a Partial-Response Maximum-Likelihood (PRML) system. Here, a partial response characteristic is assumed to be PR (1, −1).

First, a decoding process of maximum-likelihood decode by the maximum-likelihood decoder 103 will be described. The decoding process of maximum-likelihood decode can be represented by a state transition diagram.

As a state S at an arbitrary time k, there are the following four states according to decoded bits $a_{k-1}$, $a_k$ at the time k−1 and the time k:

S00 ($a_{k-1}$=0, $a_k$=0)
S01 ($a_{k-1}$=0, $a_k$=1)
S10 ($a_{k-1}$=1, $a_k$=0)
S11 ($a_{k-1}$=1, $a_k$=1)

Figure 2:
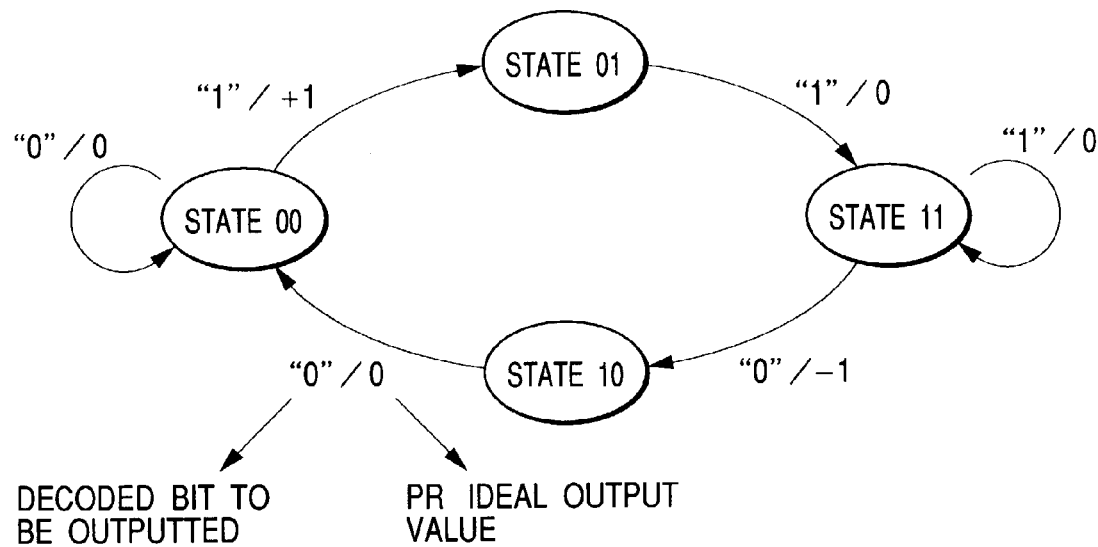
FIG. 2 illustrates a state transition of maximum-likelihood decode in accordance with the present invention.
Figure 3:
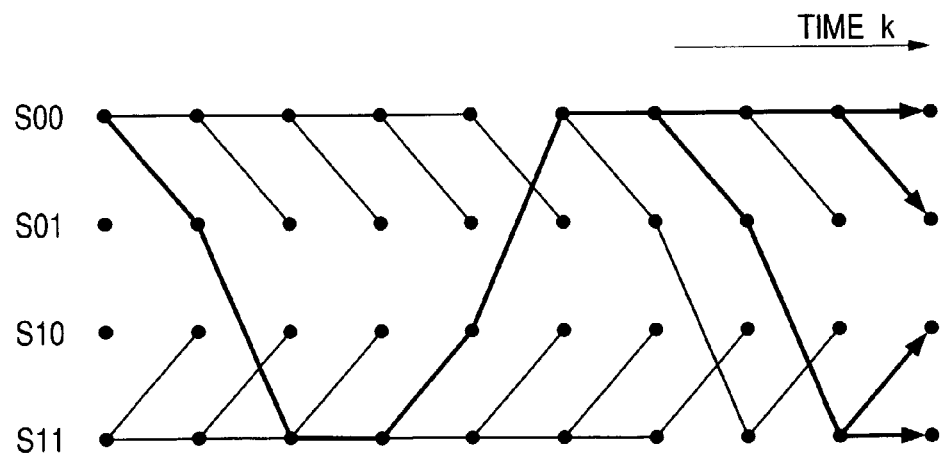
FIG. 3 is a trellis diagram of the maximum-likelihood decode in accordance with the present invention.

A state transition diagram in this case is shown in FIG. 2. As shown in FIG. 2, each state transits to the next state according to a decoded bit to be outputted. For example, when the maximum-likelihood decode is in the state 00 (S00), if an ideal output value of PR is +1, the maximum-likelihood decoder 103 outputs the decoded bit "1" to transit to the state 01 (S01). On the other hand, when the maximum-likelihood decode is in the state 00 (S00), if an ideal output value of PR is 0, the maximum-likelihood decoder 103 outputs the decoded bit "0" to maintain the state 00 (S00). FIG. 3 is a trellis diagram that is obtained by developing the state transition diagram of FIG. 2 in a time axis direction. A state transition at each time of FIG. 3 is called a branch, and probability of each branch is called a branch metric, which is represented by the following expression (1):

$$\text{branch metric} = (z_k - Y_k)^2 \quad (1)$$

wherein, $z_k$ is a reproducing signal sequence after PR (1, −1) to be actually outputted, and $y_k$ is an output value of PR (1, −1) with respect to an ideal reproducing sequence.

Here, since the minimum run length is restricted to 1, state transition in which the decoded bit is equivalent to 0–1–0, 1–0–1 is excluded in advance.

As described above, in the case in which a recording symbol sequence using a condition of the minimum run length of the RLL (1, 7) symbol being 1 (hereinafter referred to as "d restriction") is decoded by PRML, a branch at each time takes a pattern shown in FIG. 4.

Figure 4:
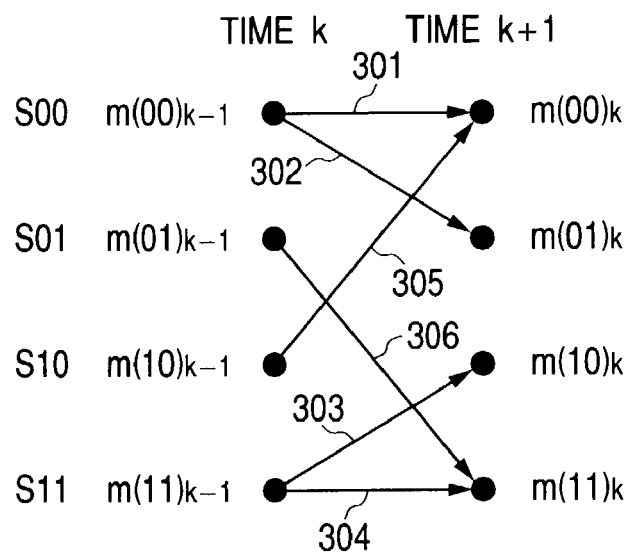
FIG. 4 illustrates branching of the maximum-likelihood decode in accordance with the present invention.

As shown in FIG. 4, branches 301 and 305 merge with each other in the state S00 at each time, and branches 304 and 306 likewise merge with each other in the state S11. In the Viterbi decode, any one of merging branches is selected at each time. The states S01 and S10 transit according to the branches 302 and 303.

A branch metric corresponding to each branch is represented as follows:

branch 301 $b(301)=(z_k-0)^2$ branch 302 $b(302)=(z_k-1)^2$ branch 303 $b(303)=(z_k+1)^2$ branch 304 $b(304)=(z_k-0)^2$ branch 305 $b(305)=(z_k-0)^2$ branch 306 $b(306)=(z_k-0)^2$ When a branch that is set at each time is joined, a trellis diagram shown in FIG. 3 is obtained. Here, a series of paths indicated by a bold line is a decoding signal sequence remaining at time k.

Probability of a decoding sequence at each time is called a path metric (likelihood), which is obtained as described below. min [A, B] means a smaller one of A and B.

State $S00_k$ $m(00)_k = \min[m(00)_{k-1}+z_k^2, m(10)_{k-1}+z_k^2]$ (2.1)

State $S01_k$ $m(01)_k = m(00)_{k-1}+(z_k-1)^2$ (2.2)

State $S10_k$ $m(10)_k = m(11)_{k-1}+(z_k+1)^2$ (2.3)

State $S11_k$ $m(11)_k = \min[m(11)_{k-1}+z_k^2, m(01)_{k-1}+z_k^2]$ (2.4)

Here, the case in which an ideal output value of PR is assumed to be −1, 0, 1 is described. The path metric mentioned here is a value represented by an accumulated value of a branch metric at each time, and a path with a minimum path metric becomes a decoded bit sequence to be outputted.

At an arbitrary time k, a decoded bit sequence corresponding to paths leading to the states S00, S01, S10, and S11 is held in four path memories of a length n (addresses $a_1$ to $a_n$). In PRML, a path memory of a path with a minimum value among path metrics of each state at the time k is referred to, and data of the address $a_1$ is outputted as a decoded bit.

As described above, in the Viterbi decode, the selection of a branch in the states S00 and S11 that are merging points of branches shown in FIG. 4 becomes a cause of an error at the time of decoding. That is, in the branch leading to the state S00 of FIG. 4, if the branch 305 is selected when a correct branch is 301, this becomes a cause of an error at the time of decoding.

When this is explained according to the expression (2.1), the following relationship is established if the branch 301 is a correct branch:

$m(00)_{k-1} < m(10)_{k-1}$ (3)

Here, in the case in which a state of a reproducing signal sequence is evaluated in a reproduction system using PRML, it is effective to use a difference between path metrics to be compared in a merging point of branches. In the above expression (3), a metric difference between two path metrics (path metric difference) to be compared is large if a state of a reproducing signal sequence is fine, that is, if an influence of edge shift is small, and the path metric difference becomes small if a state of a signal is bad, that is, if an influence of edge shift is large. Therefore, an absolute value of a metric difference between two path metrics to be compared is assumed to be Δm, which is defined as follows:

$\Delta m_k = |m(00)_{k-1} - m(10)_{k-1}|$ (4)

Figure 5:
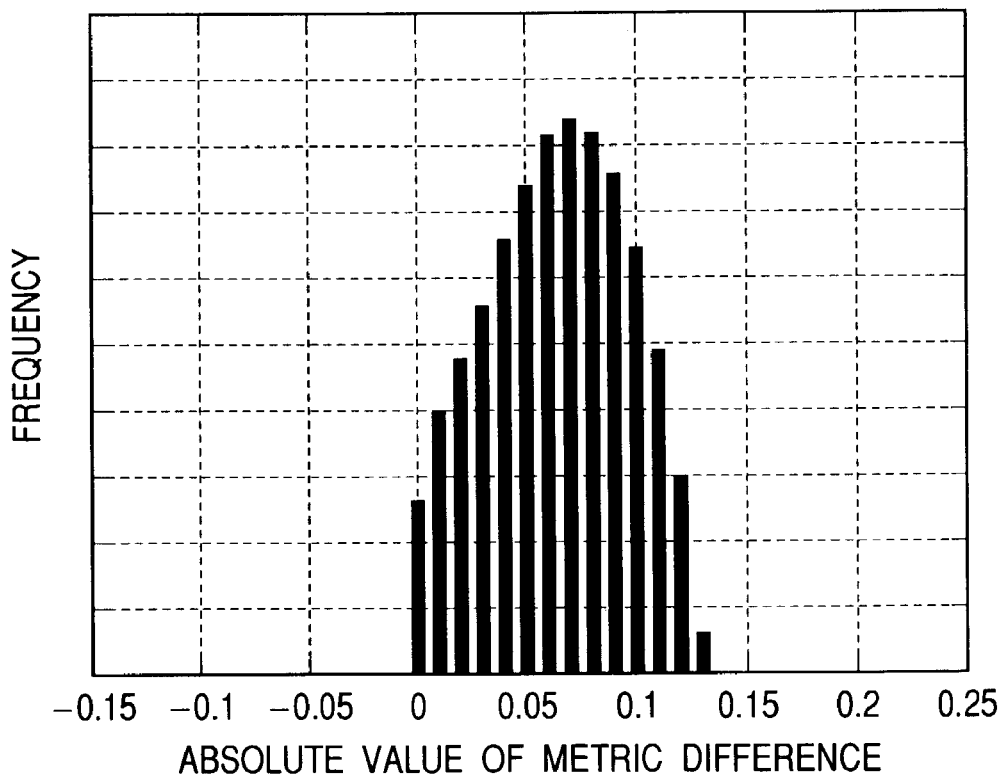
FIG. 5 is a graph explaining a distribution of metric differences of the maximum-likelihood decode in accordance with the present invention.

FIG. 5 shows a distribution of the metric difference Δm. The distribution of the metric difference includes an error of a reproducing signal amplitude and an error of a phase. That is, it reflects an influence of edge shift.

Since the metric difference is evaluated according to an absolute value as shown in the expression (4), a negative value does not exist. Here, since the metric difference is a difference between two path metrics in a merging point, the larger the difference, a correct path can be selected with higher reliability. On the other hand, if the metric difference is small, since it is difficult to distinguish a correct path from a wrong path, a probability of occurrence of an error increases.

In the distribution of a metric difference shown in FIG. 5, a frequency in the vicinity of a point where the metric difference is zero represents a sample with a high probability of occurrence of an error.

Therefore, as an evaluation index representing a state of a reproducing signal in the present invention, a frequency of a metric difference equal to or lower than a predetermined threshold value set in the vicinity of zero is used.

In the case in which various parameters are adjusted, it is sufficient to hold a value of an evaluation index in each adjustment value and set values of parameters according to an adjustment value to which a minimum value of the evaluation index is given.

Figure 6:
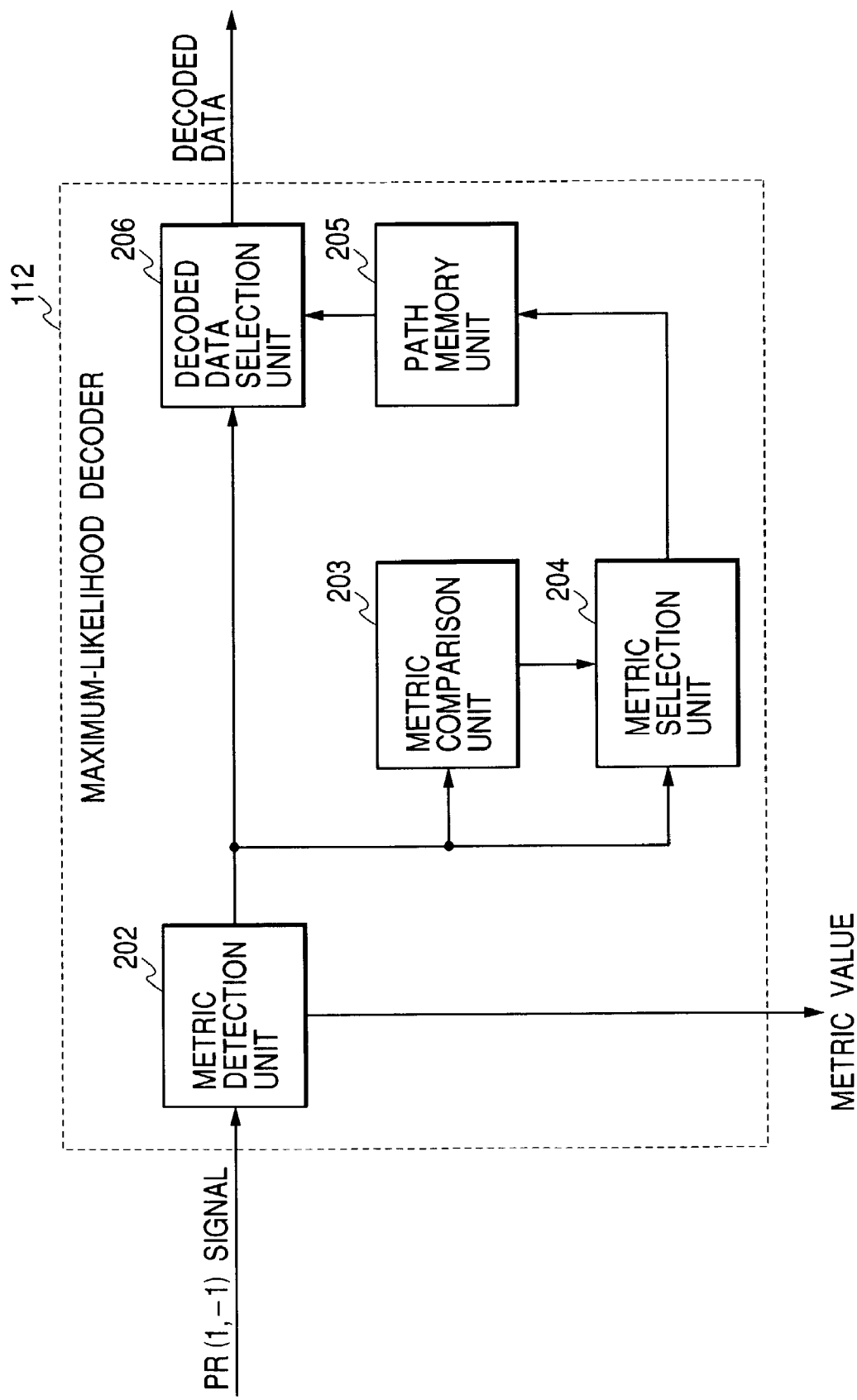
FIG. 6 is a block diagram of a maximum-likelihood decoder of Embodiment 1 in accordance with the present invention.

FIG. 6 is a schematic diagram of a maximum-likelihood decoder. In a metric detection unit 202, a path metric is calculated based on a PR equalized waveform. The calculation of a path metric uses the expressions (2.1) through (2.4).

In a metric comparison unit 203, size distinction of two path metrics in the expressions (2.1) and (2.4) is performed.

In a metric selection unit 204, a metric value of each state is updated based on a result of the size distinction. In addition, a control signal is outputted based on the result of the size distinction.

Figure 7:
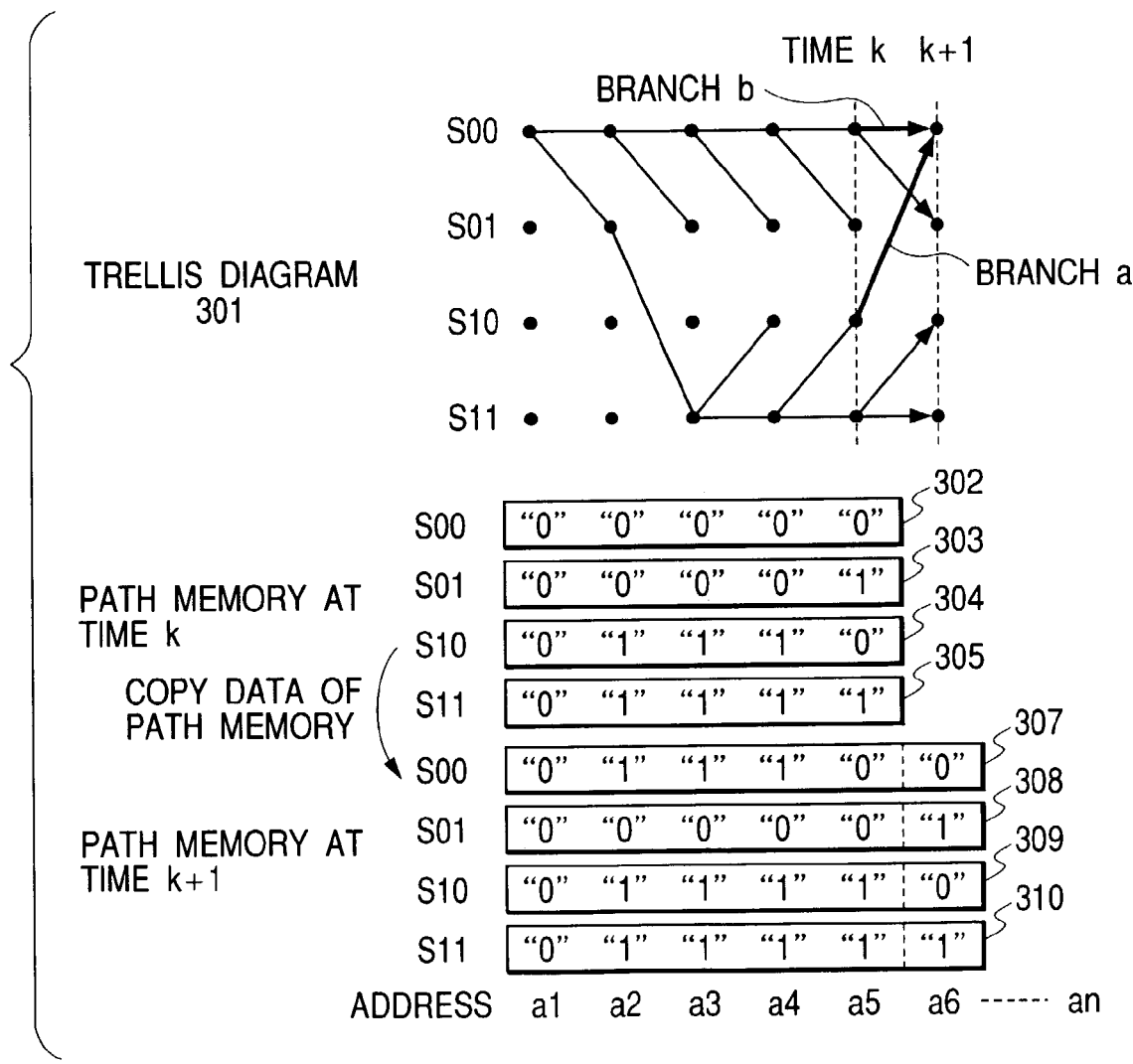
FIG. 7 illustrates an operation of the maximum-likelihood decode in accordance with the present invention.

A path memory unit 205 is a memory for holding decoded data corresponding to a path of each state, in which 4×n decoded data candidates corresponding to the states S00, S01, S10, and S11 are held as shown in FIG. 7. Values of the aforementioned four path memories are updated based on a control signal outputted from the metric selection unit 204.

FIG. 7 schematically illustrates control of the path memory unit. In FIG. 7, reference numeral 301 denotes the aforementioned trellis diagram of maximum-likelihood decode. In addition, reference numerals 302 to 305 denote path memories corresponding to the states S00, S01, S10, and S11 at the time k. Moreover, reference numerals 307 to 310 denote values of the path memories at the time k+1.

Control of the path memories will be described based on the path leading to the state S00 at the time k+1. In the state S00, the branches "a" and "b" merge with each other. In this case, as indicated in the expression (2.1), a path metric corresponding to the branch "a" and a path metric corresponding to the branch "b" are compared in the metric comparison unit 203.

Here, if the path metric shown in the branch "a" is selected, the path of the branch "a" remains and the path of the branch "b" disappears. Based on a control signal outputted in association with this, a value of the path memory 307 at the time k+1 is copied by the path memory 304, and "0" is added to the rear end thereof. If the number of decoded data of each path memory exceeds n, the decoded data are bit-shifted in the left direction sequentially.

In a decoded data selection unit 206, one decoded data is selected from the aforementioned four path memories. Path metrics corresponding to four states at the time k are generated in maximum-likelihood decode. In the decoded data selection unit 206, a state of giving a smallest path metric among them is selected, and a decoded bit of a leading address of a path memory corresponding to the selected state is outputted.

Decoded data of PRML is generated by the above-described system.

In such a magneto-optical recording and reproducing apparatus, in order to set various parameters (off-track, laser reproducing power, laser recording power, etc.) to optimal values, indexes for adjusting the various parameters and evaluating a state of a signal in that case are important.

The evaluation index generation unit 113 generates an evaluation index based on an absolute value of a metric difference generated in a decoding process of PRML as described above.

Figure 8:
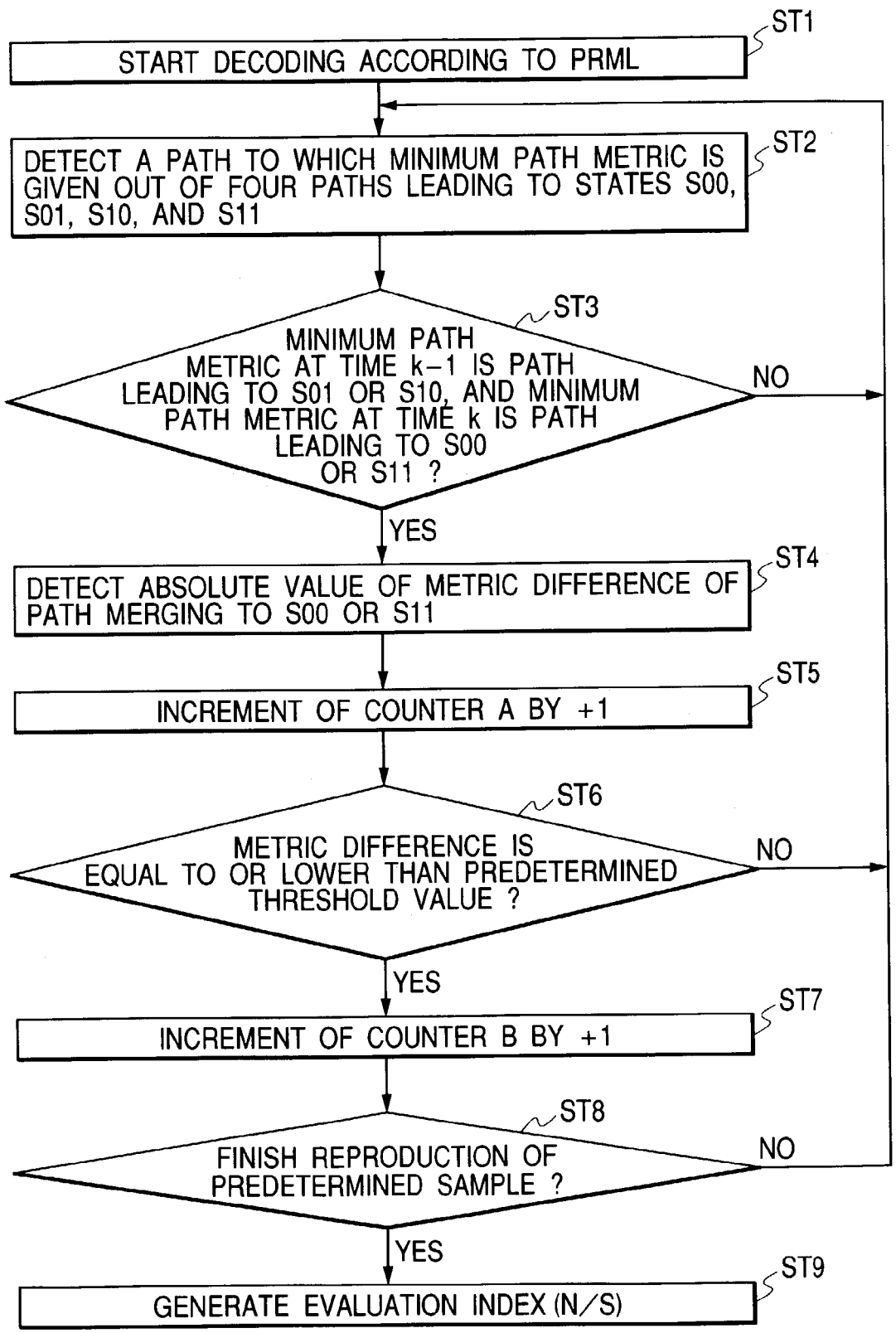
FIG. 8 is a flow chart of processing for evaluation index detection of Embodiment 1 in accordance with the present invention.

Operations of the evaluation index generation unit will be hereinafter described with reference to a flow chart of FIG. 8.

After starting decoding of PRML (step ST1), the evaluation index generation unit detects a path of giving a minimum path metric out of four path metrics leading to the states S00, S01, S10, and S11 at each time (step ST2).

Next, the evaluation index generation unit detects a state of giving a minimum path metric at the present time k and a minimum path metric at the time k−1 (step ST3). In the maximum-likelihood decode, since the transitions from the state S01 to the state S11 and from the state S10 to the state S00 correspond to an edge portion of a reproducing signal, the evaluation index generation unit calculates a metric difference if the detected results are as follows (step ST4):

| Minimum path at time k-1 | Minimum path at time k |
|---|---|
| S01 | S11 → calculate a metric difference |
| S10 | S00 → calculate a metric difference |
| States other than the above → not detected | |

A metric difference is an absolute value of a difference of path metrics of two paths merging with each other in the state S00 or S11. In this way, a metric difference in an edge portion of a reproducing signal is calculated. Here, if an influence of edge shift due to a floating magnetic field is small, the metric difference is large, and a correct path can be selected with higher reliability. On the other hand, if an influence of edge shift due to a floating magnetic field is large, the metric difference is small, and a probability of occurrence of an error increases because it becomes difficult to distinguish a correct path from a wrong path.

Each time a path metric is calculated, +1 is added to a value of a counter A (step ST5).

Next, the evaluation index generation unit compares an absolute value of the calculated metric difference with a predetermined threshold value, and if the absolute value is equal to or less than the predetermined threshold value, +1 is added to a value of a counter B (step ST6, step ST7). At a point when reproduction is finished for a predetermined sample for parameter adjustment, the evaluation index generation unit generates an evaluation index (step ST8, step ST9).

The above is a basic flow of metric difference detection.

Figure 9:
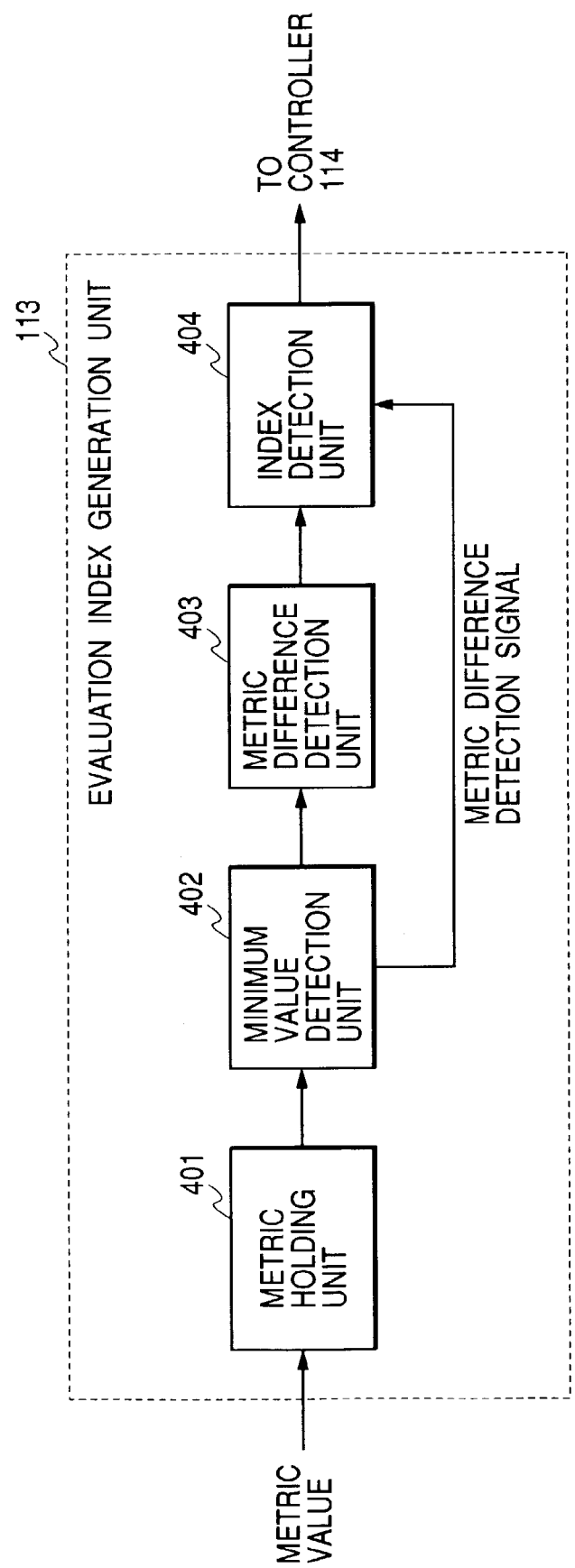
FIG. 9 is a block diagram of an evaluation index generation unit of Embodiment 1 in accordance with the present invention.

FIG. 9 is a schematic diagram of the evaluation index generation unit 113. A metric value corresponding to each state is given to the evaluation index generation unit 113 from the maximum-likelihood decoder 112. Reference numeral 401 denotes a metric holding unit, in which a metric value of each state at the present time and at the preceding time is held. Reference numeral 402 denotes a minimum value detection unit, which selects a state of giving a minimum metric from a metric value at the present time. Reference numeral 403 denotes a metric difference detection unit, which generates a metric difference in the case in which a state of giving a minimum metric coincides with the above-described conditions. Procedures for generating a metric difference are as described above.

The generated metric difference is given to an index detection unit 404. FIG. 10 schematically illustrates the index detection unit 404. When it is determined in the minimum value detection unit 402 that the state S00 or the state S11 is a minimum value, a metric difference detection signal is outputted to the index detection unit 404 as a trigger signal. When the metric difference detection signal is inputted, a value of a counter A 411 is incremented in the index detection unit 404. In addition, a comparator 410 compares metric difference information with a predetermined threshold value, and if it is equal to or less than the predetermined threshold value, a value of a counter B 412 is incremented. According to the above processing, the index detection unit 404 compares an absolute value of a metric difference with the predetermined threshold value to measure a number N of a metric difference (value of the counter B) smaller than the threshold value. At the same time, the index detection unit 404 measures a total number S of metric differences to be detected (value of the counter A).

At the point when reproduction is finished for a predetermined sample for parameter adjustment, the evaluation index generation unit 113 generates an evaluation index. Here, a number obtained by dividing the number N of a metric difference smaller than the threshold value by the total number S of metric differences is outputted from an index calculation unit 413 as the evaluation index.

Figure 11A:
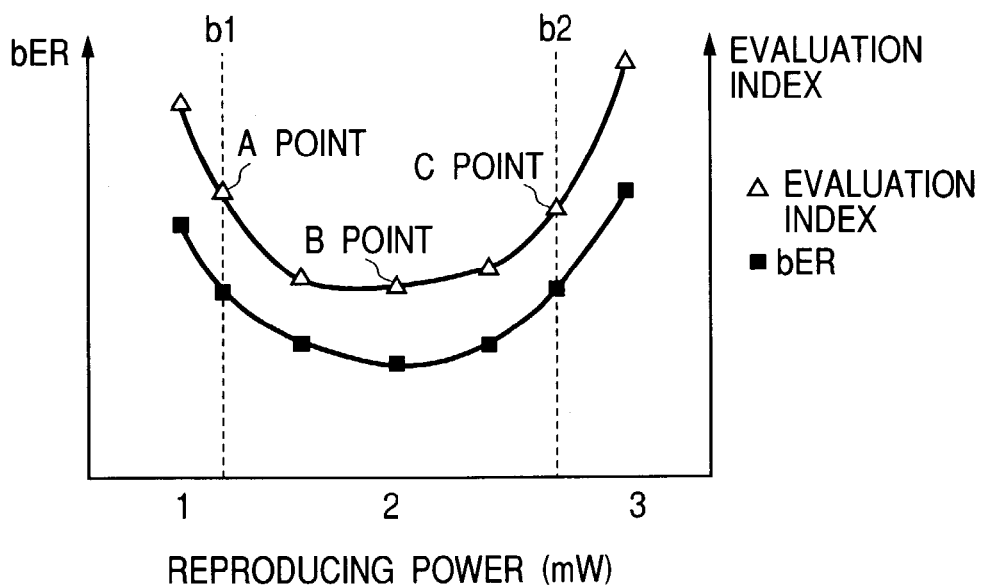
FIGS. 11A, 11B, and 11C are schematic graphs showing a parameter adjustment method of Embodiment 1 in accordance with the present invention.
Figure 11B:
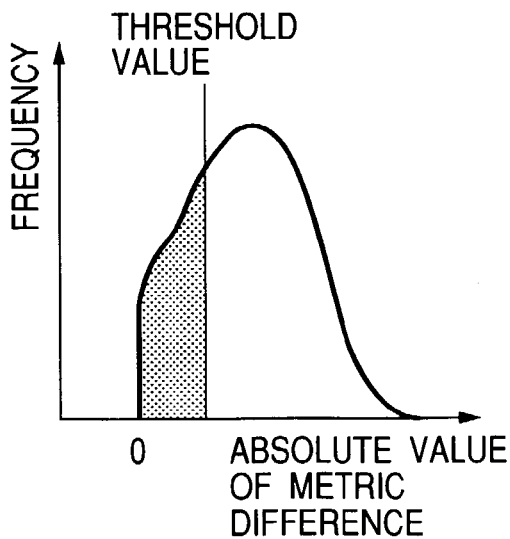
Figure 11C:
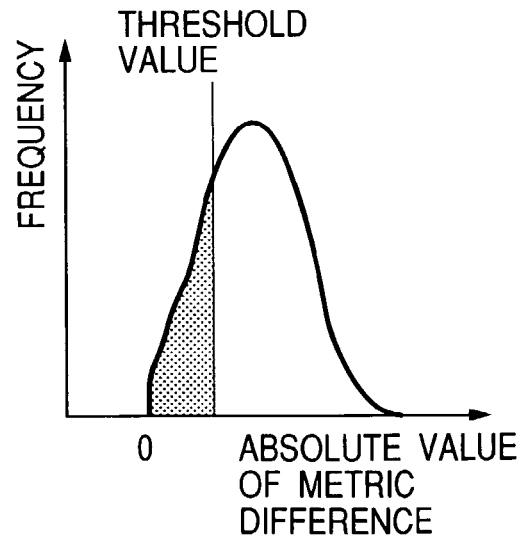

FIGS. 11A to 11C are characteristic diagrams showing a relationship among a variation of a reproducing power, an error rate, an evaluation index, and a metric difference distribution.

A relationship between the evaluation index and the reproducing power will be described. FIG. 11A is a graph showing a relationship between the evaluation index and the reproducing power. As the reproducing power increases, since returning light to the sensor increases and an amplifier noise or the like is constant, S/N rises. However, since the Kerr effect weakens in accordance with increase in temperature from a certain reproducing power or more, a signal component rather decreases and S/N worsens. Thus, at the A point, a frequency at a predetermined threshold value or less of a distribution of metric difference increases as shown in FIG. 11B, and a value of the evaluation index increases.

At the B point, a distribution of metric difference becomes steep as shown in FIG. 11C, and a frequency at the predetermined threshold value or less decreases. Moreover, at the C point, a distribution of metric difference becomes gentle similarly as at the A point, and the evaluation index increase again.

Figure 12:
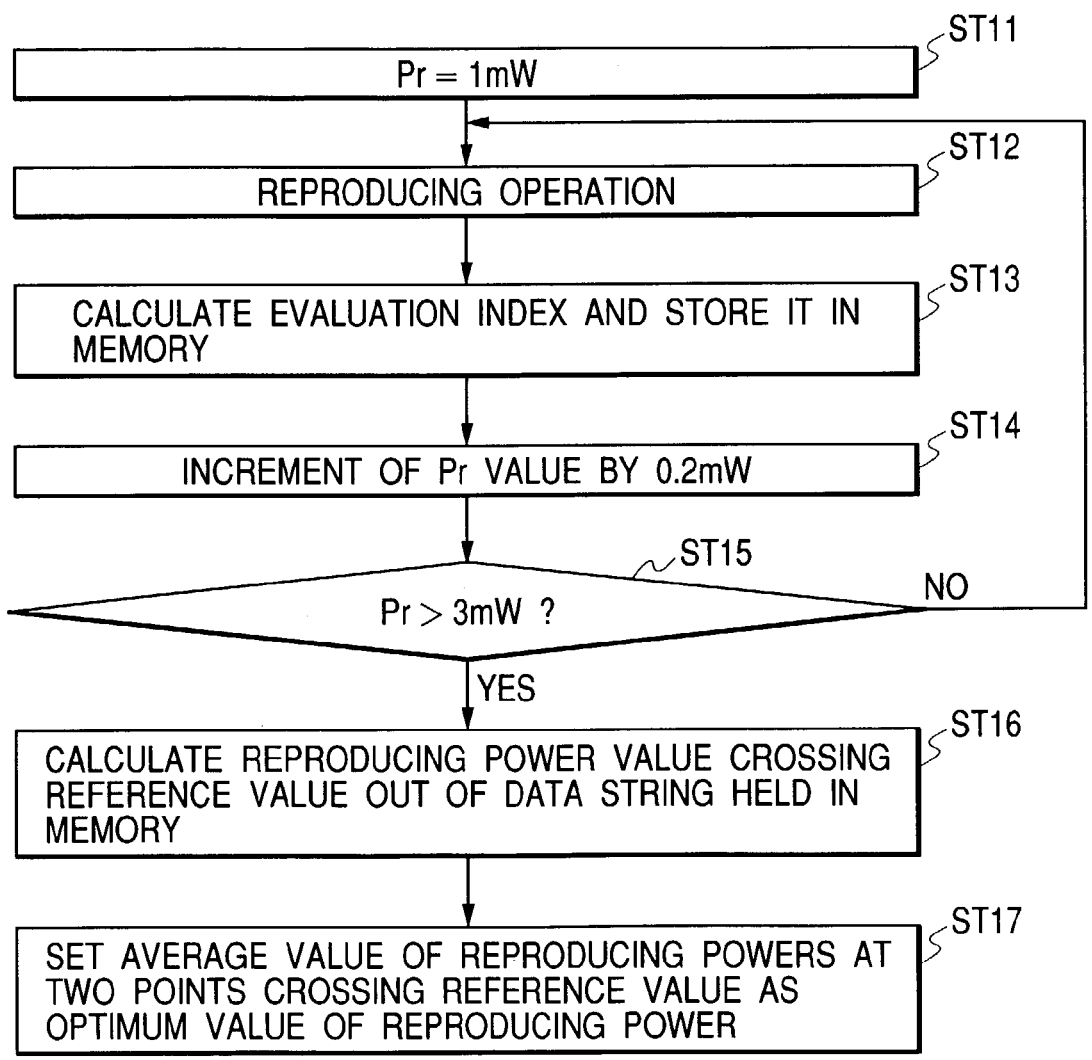
FIG. 12 is a flow chart of parameter adjustment of Embodiment 1 in accordance with the present invention.

From this relationship, an algorithm of a series of operations of reproducing power optimization will be described based on FIG. 12. An optimum value of a reproducing power is assumed to be between 1 to 3 mW. First, a laser is turned on with 1 mW as a predetermined minimum reproducing power Pr (step ST11) to perform a reproducing operation (step ST12). Then, an evaluation index at this point is measured and held in a memory or the like (step ST13). Moreover, the reproducing power Pr is increased by 0.2 mW (step ST14), and if a value of Pr is not larger than 3 mW (step ST15), a reproducing operation is performed to measure an evaluation index. This procedure is continued, and at the time when the reproducing power reaches 3 mW that is a predetermined maximum reproducing power value, the algorithm leaves a loop of evaluation index measurement.

Next, a reproducing power value crossing a reference value is calculated from a data string held in the memory (step ST16), and an average value of reproducing powers at two points crossing the reference value is set as an optimum value of a reproducing power (step ST17). Here, for example, reproducing powers b1 and b2 at points where an evaluation index is crossing the reference value are detected, and an optimum reproducing power adjustment value is obtained from the average value.

(Embodiment 2)

In this embodiment, an average value of metric differences equal to or lower than a predetermined threshold value is used as an evaluation index. This embodiment is different from Embodiment 1 in an operation at a metric difference detection point.

Figure 13:
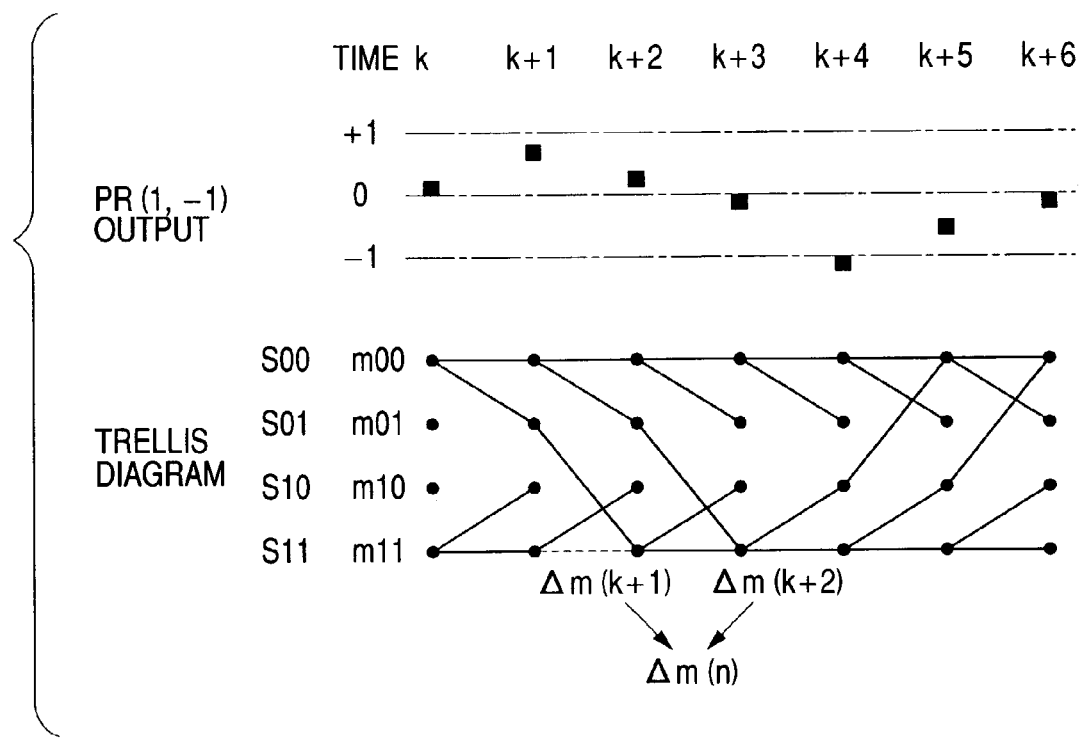
FIG. 13 schematically illustrates metric difference detection of Embodiment 2 in accordance with the present invention.

The metric difference detection point and the detection operation will be described schematically with reference to FIG. 13. FIG. 13 shows a signal, which is a reproducing signal subjected to PR (1, −1) equalization, and a trellis diagram.

The metric difference detection of this embodiment compares path metrics of the state S00, S01, S10, and S11 at each time and detects the following conditions as in Embodiment 1:

| Minimum path at time k−1 | Minimum path at time k |
|---|---|
| S01 | S11 → calculate a metric difference |
| S10 | S00 → calculate a metric difference |
| States other than the above → not detected | |

In the trellis diagram of FIG. 13, the above-described paths are generated at the time k+2 and the time k+5. Here, detection of a metric difference at the point of the time k+2 will be described. First, an absolute value of a difference between path metrics m01(k+1) and m11(k+1) of two paths merging to the state S11 at the time k+2 are obtained as a metric difference $\Delta m(k+1)$. ($\Delta m(k+1)=|m01(k+1)-m11(k+1)|$)

Next, an absolute value of a difference between path metrics m01(k+2) and m11(k+2) of two paths merging to the state S11 at the time k+3 are obtained as a metric difference $\Delta m(k+2)$. ($\Delta m(k+2)=|m01(k+2)-m11(k+2)|$)

These two metric differences are compared, and a smaller one is adopted as a metric difference to be used in an evaluation index as shown in expression (5) shown below. This is the same for the time k+5.

$$\Delta m(n)=\min[\Delta m(k+1), \Delta m(k+2)] \qquad (5)$$

Metric differences are always detected at two times in a row with respect to an edge-like path, which is generated at an arbitrary time, by detecting a metric difference with the above-described method. Thus, an evaluation index that more reflects an influence of edge shift compared with Embodiment 1 is obtained.

Here, although a smaller one of the metric differences is selected as shown in the expression (5), a larger one of metric differences at consecutive two times may be selected according to characteristics of a medium and a recording and reproducing system and error factors. In addition, it is also possible to generate an evaluation index based on both the two metric differences and a distribution according to an average value.

A generation method of an evaluation index of this embodiment are shown in FIGS. 14A and 14B. FIGS. 14A and 14B show a distribution of metric differences at the time when an off-track quantity varies.

When the off-track quantity increases as shown in FIG. 14B, a frequency of a metric difference equal to or lower than a threshold value T increases compared with the case of FIG. 14A in which the off-track quantity is small. Therefore, when a state of a reproducing signal worsens, an average value of a metric differences equal to or lower than the threshold value T shifts to the direction of zero. In this embodiment, fluctuation at the time of measuring the evaluation index can be reduced to steadily evaluate a state of a reproducing signal by adopting the average value of metric differences equal to or lower than the threshold value as an evaluation index.

(Embodiment 3)

In a magneto-optical recording and reproducing apparatus of this embodiment, detection timing of a metric difference is different from that in the other embodiments. Operations of the magneto-optical recording and reproducing apparatus will be described based on a flow chart of FIG. 15.

(Step ST21)

The magneto-optical recording and reproducing apparatus outputs a reproducing signal sequence to start decoding according to PRML.

(Step ST22)

The magneto-optical recording and reproducing apparatus detects a path, to which a minimum path metric is given, out of four paths leading to the state S00, S01, S10, and S11 at an arbitrary time k.

(Step ST23, step ST24)

The magneto-optical recording and reproducing apparatus determines whether the minimum path metric is a path leading to the state S00 or the state S11 (step ST23). If a result of the determination is yes, the magneto-optical recording and reproducing apparatus detects a metric difference (step ST24). The metric difference is the same as the aforementioned embodiments. In addition, if a result of determination is no, the magneto-optical recording and reproducing apparatus sets a flag to "0" (step ST27).

(Step ST25)

If the flag is "1", the magneto-optical recording and reproducing apparatus compares the detected metric difference with a metric difference previously held in a memory and selects a smaller one to update the metric difference. If the flag is "0", the magneto-optical recording and reproducing apparatus holds the detected metric difference and sets the flag to "1" (step ST26).

(Step ST28, step ST29)

If a result of determination in step ST23 is no, the magneto-optical recording and reproducing apparatus determines whether or not a metric difference is held (step ST28), and if it is held, +1 is added to a value of the counter A (step ST29).

(Step ST30, step ST31)

The magneto-optical recording and reproducing apparatus determines whether or not the metric difference is equal to or lower than a predetermined threshold value, and a result of determination is yes, +1 is added to a value of the counter B (step ST31). On the other hand, if a result of determination is no, the magneto-optical recording and reproducing apparatus cancels the metric difference held in the memory.

A metric difference and an index are obtained by the above procedures.

Figure 16:
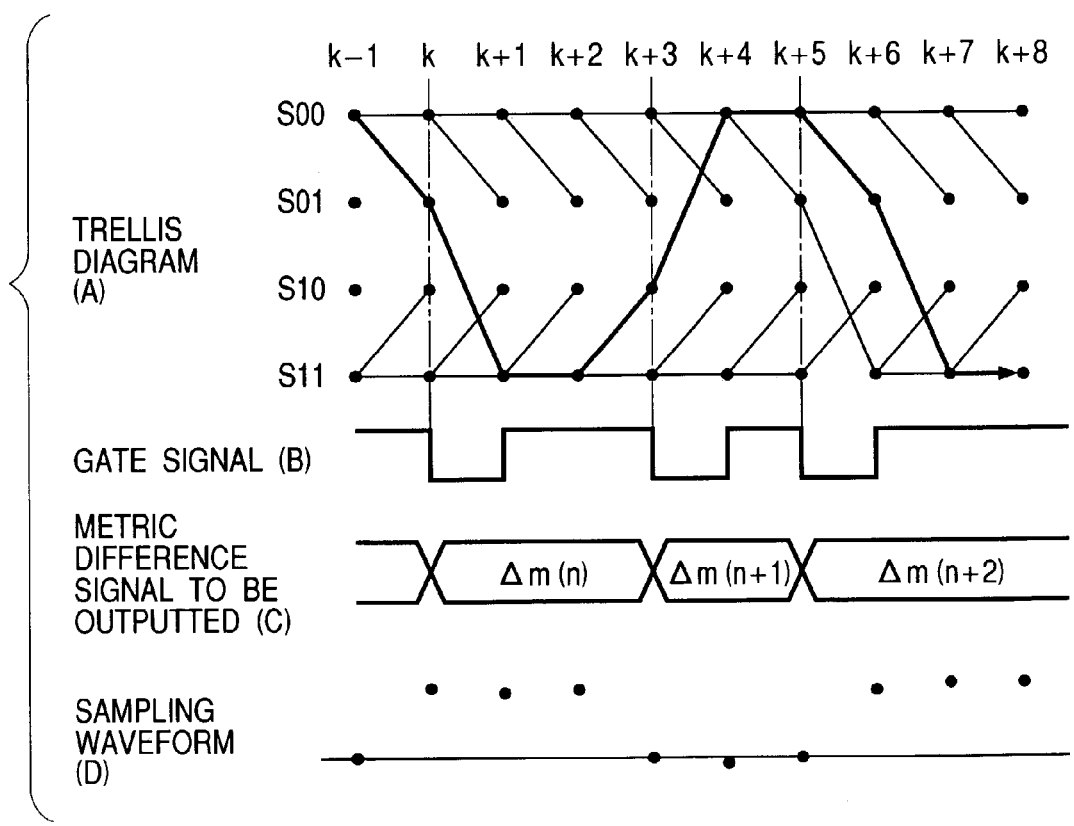
FIG. 16 schematically illustrates metric difference detection of Embodiment 3 of the present invention.

FIG. 16 shows operation timing. In FIG. 16, a trellis diagram (A), a gate signal (B), a metric difference data (C), and a sampling waveform (D) are shown from the top. Operations will be hereinafter described.

1) In the case in which a gate is Low at the time k and a metric difference between the states S00 and S11 is a minimum value, the magneto-optical recording and reproducing apparatus sets the gate to High and detects an absolute value of a metric difference of a path merging to the state S11.

2) In the case in which the state S11 is minimum at the time k+1, the magneto-optical recording and reproducing apparatus compares a value of the metric difference at the time k and a value of a metric difference obtained at the time k+1, and if a path metric at the time k+1 is smaller, the magneto-optical recording and reproducing apparatus detects an absolute value of the metric difference at the time k+1 to update and hold it.

3) The magneto-optical recording and reproducing apparatus repeats the processing of 2), and if a path metric of a state other than the state S11 becomes minimum at the time k+3, sets the gate to Low and, at the same time, returns to 1) after outputting an absolute value ($\Delta m(n)$) of the metric difference held in the memory.

Figure 17:
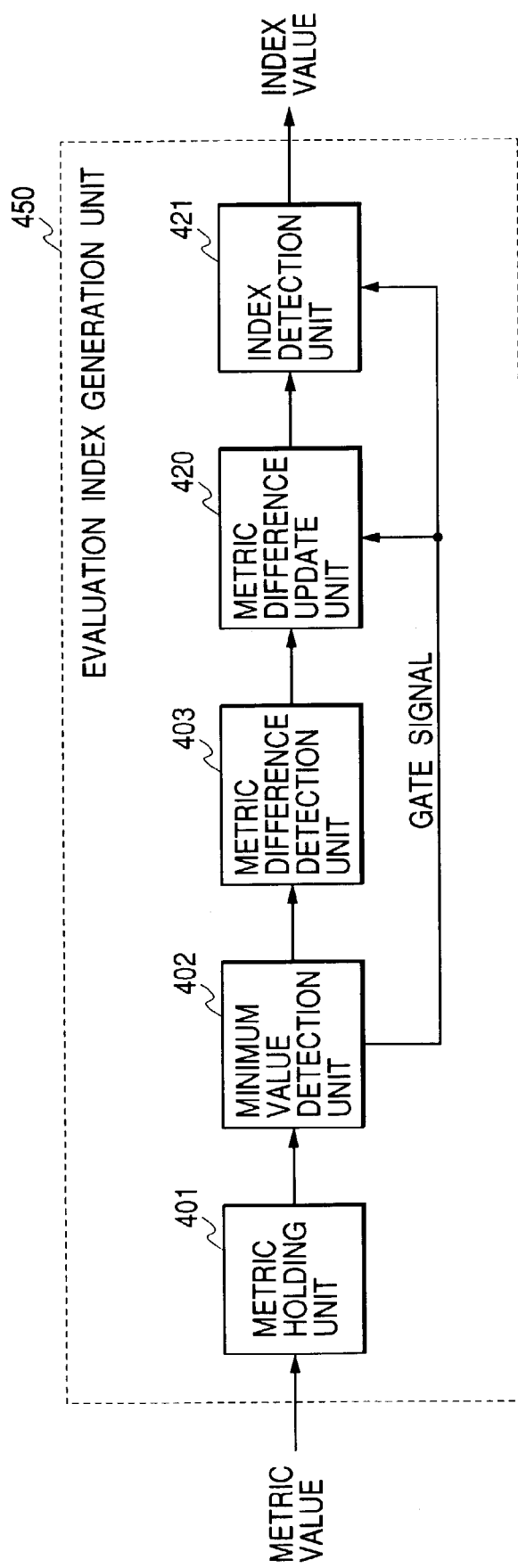
FIG. 17 is a schematic diagram of an evaluation index generation unit of Embodiment 3 in accordance with the present invention.

FIG. 17 is a block diagram of an evaluation index generation unit 450 of this embodiment. Since the metric holding unit 401 and the metric difference detection unit 403 are the same as those of Embodiment 1, descriptions of them will be omitted. The minimum value detection unit 402 detects a minimum value of path metrics of the four states S00, S01, S10, and S11 at the present time, and sets a level of a gate signal to "High" if the minimum value is the state S00 or S11 or sets the level to "Low" if the minimum value is the state S01 or S10.

The metric difference update unit 420 executes update processing of a metric difference in the above 2) at each time. Whether a flag is "1" or "0" is stored in a memory that the metric difference update unit 420 has in its inside. In addition, the index detection unit 421 has in its inside the counter A and the counter B shown in the flow chart of FIG. 15 and a comparator for comparing a metric difference value with a predetermined threshold value. The index detection unit 421 performs the increment of a value of the counter A in synchronous with a rising edge of a gate from the minimum value detection unit 402 and, at the same time, compares an absolute value $\Delta m(n)$ of a metric difference, which is outputted from the metric update unit 420 in synchronous with a rising edge of a gate signal, with a predetermined threshold value and performs the increment of the counter B of the absolute value is equal to or lower than the threshold value. Finally, an index is a value obtained by dividing the value of the counter B by the value of the counter A. A connection relationship among the counter A, the counter B, and the comparator is the same as that in FIG. 10.

One metric difference is outputted according to a change in polarity of a reproducing signal by detecting a metric difference with the above procedures. If a signal is reproduced with maximum-likelihood decode, an error often occurs by a unit of a change in polarity, that is, one mark (space). Thus, it becomes possible to detect a state of a reproducing signal by representing reliability of the change in polarity with a metric difference.

Here, although a metric difference is updated if the metric difference is smaller than a value held in the memory, or a metric difference may be updated if the metric difference is larger than a value held in the memory according to characteristics of a medium and a recording and reproducing system and error factors. In addition, it is needless to mention that it is possible to use an average value of metric differences in a section where the gate is High.

Although the above embodiments have been described using a magneto-optical recording and reproducing apparatus, the present invention is applicable to an optical recording and reproducing apparatus of other types such as a DVD-R, a CD-R, or a CD-RW. In particular, the present invention can be utilized preferably in an apparatus using a magnetic domain wall moving type magneto-optical recording medium (U.S. Pat. No. 6,027,825) that is susceptible to an influence of a floating magnetic field from its periphery at the time of reproduction.

Further, although the above embodiments have been described with optimization of a reproducing power as an example, adjustment of other parameters (recording power, tracking and/or focusing gain, offset, etc.) can also be realized easily using the evaluation index of the present invention. For example, in the case of a recording power, it is possible to record a predetermined signal while switching a laser power for each predetermined period, thereafter reproduce the recorded signal with a constant reproducing power, and find an optimum recording power based on an evaluation index corresponding to each recording power.

In addition, data to be reproduced for the preparation of an evaluation index in the above embodiments may be existing user data or dedicated data. In the former case, it becomes possible to generate an evaluation index on a real time basis while performing ordinary data reproduction.

The present invention is applicable not only to an apparatus provided with both the functions of recording and reproduction but also to an apparatus provided with only the reproducing function.

What is claimed is:

1. An optical information recording and reproducing method for subjecting a reproducing signal, which is obtained from a recording medium, to maximum-likelihood decode to reproduce information, the method comprising the steps of:

subjecting the reproducing signal to maximum-likelihood decode, wherein in said maximum-likelihood decode, a state of giving a minimum path metric at each time is detected;

based on state transition of said detected state, detecting paths coupling with each other and obtaining a difference of likelihoods of the paths; and adjusting a parameter of a recording and reproducing signal or a control signal of an optical pickup based on the difference of likelihoods.

2. The optical information recording and reproducing method according to claim 1, wherein the parameter is auto-tracking, gain of an auto-focusing loop, or an offset value.

3. The optical information recording and reproducing method according to claim 1, wherein the parameter is a gain value of the reproducing signal, a recording power, or a reproducing power intensity.

4. The optical information recording and reproducing method according to claim 1, wherein a distribution of the difference of likelihoods is obtained, and the parameter is adjusted based on the distribution.

5. The optical information recording and reproducing method according to claim 1, wherein the parameter is adjusted based on a total number of the obtained likelihood differences and the number of likelihood differences equal to or lower than a predetermined threshold value.

6. The optical information recording and reproducing method according to claim 1, wherein the obtained difference of likelihoods equal to or lower than a predetermined threshold value is subjected to statistic processing to adjust the parameter.

7. An optical information recording and reproducing apparatus for subjecting a reproducing signal, which is obtained from a recording medium, to maximum-likelihood decode to reproduce information, the apparatus comprising:

a circuit for subjecting the reproducing signal to maximum-likelihood decode, wherein in the maximum-likelihood decode, a state of giving a minimum path metric at each time is detected;

a circuit for, based on state transition of the detected state, detecting paths coupling with each other and obtaining a difference of likelihoods of the paths; and a circuit for adjusting a parameter of a recording and reproducing signal or a control signal of an optical pickup based on the difference of likelihoods.

* * * * *

UNITED STATES PATENT AND TRADEMARK OFFICE
CERTIFICATE OF CORRECTION

PATENT NO.         : 7,006,421 B2
APPLICATION NO. : 10/357225
DATED                : February 28, 2006
INVENTOR(S)       : Tatsushi Katayama It is certified that error appears in the above-identified patent and that said Letters Patent is hereby corrected as shown below:

COLUMN 4
Line 60, "of an" should read --of a--.

COLUMN 11
Line 11, "increase" should read --increases--.

COLUMN 14
Line 3, "synchronous" should read --synchronicity--.
Line 7, "synchronous" should read --synchronicity--.

Signed and Sealed this

Fifth Day of September, 2006

JON W. DUDAS
*Director of the United States Patent and Trademark Office*